(12) United States Patent
Yamazaki

(10) Patent No.: US 9,143,152 B2
(45) Date of Patent: Sep. 22, 2015

(54) AD CONVERSION CIRCUIT AND SOLID-STATE IMAGE PICKUP DEVICE

(71) Applicant: OLYMPUS CORPORATION, Tokyo (JP)

(72) Inventor: Susumu Yamazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 228 days.

(21) Appl. No.: 13/975,542

(22) Filed: Aug. 26, 2013

(65) Prior Publication Data

US 2014/0061437 A1    Mar. 6, 2014

(30) Foreign Application Priority Data

Aug. 28, 2012  (JP) ................. 2012-187723

(51) Int. Cl.
| | |
|---|---|
| H03M 1/50 | (2006.01) |
| H03M 1/56 | (2006.01) |
| H03M 1/34 | (2006.01) |
| H04N 5/378 | (2011.01) |
| H03M 1/14 | (2006.01) |
| H03M 1/12 | (2006.01) |

(52) U.S. Cl.
CPC .... *H03M 1/34* (2013.01); *H03M 1/14* (2013.01); *H04N 5/378* (2013.01); *H03M 1/123* (2013.01); *H03M 1/56* (2013.01)

(58) Field of Classification Search
CPC ................................. H03M 1/50; H03M 1/56
USPC ............................. 250/208.1; 341/157, 169
See application file for complete search history.

(56) References Cited

U.S. PATENT DOCUMENTS

2013/0146751 A1*   6/2013   Hagihara .................. 250/208.1

FOREIGN PATENT DOCUMENTS

| JP | 2012-039386 A | 2/2012 |
|---|---|---|
| WO | WO 2012017730 A1 * | 2/2012 |

* cited by examiner

*Primary Examiner* — Renee D Chavez
(74) *Attorney, Agent, or Firm* — Westerman, Hattori, Daniels & Adrian, LLP

(57) ABSTRACT

An AD conversion circuit includes: a comparison unit that receives an analog signal and a reference signal, compares voltages of the signals, and outputs a first comparison signal; a signal generation unit that outputs a second comparison signal for switching a logic state, and outputs a third comparison signal that is a result of a logic operation on the first comparison signal and the second comparison signal; a control unit that outputs an enable signal; a clock generation unit that outputs first to $n^{th}$ clock signals having different phases; a latch unit that includes first to $n^{th}$ latch units, each of the first to $n^{th}$ latch units including an input terminal, a first control terminal, a second control terminal, and an output terminal, and latches a logic state of the one of the first to $n^{th}$ clock signals; and a count unit that performs a count operation.

5 Claims, 9 Drawing Sheets

AD CONVERSION CIRCUIT AND SOLID-STATE IMAGE PICKUP DEVICE

BACKGROUND OF THE INVENTION

1. Field of the Invention

The present invention relates to an analog-to-digital (AD) conversion circuit, which converts an analog signal into digital data, and a solid-state image pickup device having the same.

Priority is claimed on Japanese Patent Application No. 2012-187723, filed Aug. 28, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

As an example of an AD conversion circuit used in a solid-state image pickup device of the related art, a configuration illustrated in FIG. 8 (for example, see Japanese Unexamined Patent Application, First Publication No. 2012-039386) is well known. First, a configuration and an operation of the AD conversion circuit illustrated in FIG. 8 will be described. The AD conversion circuit illustrated in FIG. 8 includes a comparison unit 11, a signal generation unit 12, a latch unit 13, a count unit 14, and a delay unit 15.

The delay unit 15 includes a plurality of delay units DU[0] to DU[7], each of which delays and outputs an input signal. A start pulse (=Start_P) is input to the leading delay unit DU[0]. The comparison unit 11 receives an analog signal Signal serving as a time detection target and ramp waves Ramp that decrease with the passage of time, and outputs an output signal CO indicating a result obtained by comparing the analog signal Signal to the ramp waves Ramp. In the comparison unit 11, a time interval (a magnitude of a time-axis direction) corresponding to an amplitude of the analog signal Signal is generated.

The signal generation unit 12 includes an inverting delay circuit DLY that inverts and delays the output signal CO, and an AND circuit AND1 that outputs an output signal Hold_L obtained by performing an AND operation on the output signal CO and an output signal xCO_D of the inverting delay circuit DLY. The latch unit 13 includes latch circuits D_0 to D_7, which latch logic states of output signals CK0 to CK7 of the delay units DU[0] to DU[7] of the delay unit 15. In addition, the latch unit 13 includes an AND circuit AND2 which outputs an output signal Hold_C obtained by performing the AND operation on the output signal xCO_D of the inverting delay circuit DLY of the signal generation unit 12 and a control signal Enable to the latch circuit D[7]. The count unit 14 includes a counter circuit which performs a count operation based on the output signal CK7 from the delay unit 15 via the latch circuit D_7.

The latch circuits D_0 to D_6 are in the enable (valid) state when an output signal Hold_L is in a high state (logic value "1"), and output the output signals CK0 to CK6 of the delay units DU[0] to DU[6]. In addition, the latch circuits D_0 to D_6 are in a disable (invalid) state when the output signal Hold_L is in a low state (logic value "0"), and latch the logical states corresponding to the output signals CK0 to CK6 of the delay units DU[0] to DU[6].

The latch circuit D_7 is in the enable (valid) state when the output signal Hold_C is in the high state, and outputs the output signal CK7 of the delay unit DU[7]. In addition, the latch circuit D_7 is in the disable (invalid) state when the output signal Hold_C is in the low (L) state, and latches the logical state corresponding to the output signal CK7 of the delay unit DU[7].

Although a count latch circuit, which latches a logic state of a count result of the count unit 14, is not illustrated, a counter circuit having a latch function is used and hence the count unit 14 also serves as the count latch circuit.

Next, an operation of the example of the related art will be described. FIG. 9 illustrates the operation of the AD conversion circuit according to the example of the related art. In FIG. 9, Q0 to Q7 denote signals output from the latch circuit D_0 to D_7.

First, at a timing (first timing) relating to a comparison start in the comparison unit 11, a clock having a cycle approximately consistent with a delay time (a sum of delay times of 8 delay units DU[0] to DU[7]) of the delay unit 15 is input as the start pulse (=Start_P) to the delay unit 15. Thereby, the operation of the delay unit 15 is started. The delay unit DU[0] constituting the delay unit 15 outputs the output signal CK0 by delaying the start pulse (=Start_P), and the delay units DU[1] to DU[7] constituting the delay unit 15 output the output signals CK1 to CK7 by delaying the output signals of previous-stage delay units, respectively. The output signals CK0 to CK7 of the delay units DU[0] to DU[7] are input to the latch circuits D_0 to D_7 of the latch unit 13. At this time, because the output signal CO of the comparison unit 11 is in the low state and the output signal xCO_D of the inverting delay circuit DLY is in the high state, the output signal Hold_L of the AND circuit AND1 of the signal generation unit 12 is in the low state, the latch circuits D_0 to D_6 are in the disable state, and operations thereof are stopped.

On the other hand, because the output signal xCO_D of the inverting delay circuit DLY is in the high state and the control signal Enable is in the high state, the output signal Hold_C of the AND circuit AND2 of the latch unit 13 is in the high state and the latch circuit D_7 is in the enable state. The latch circuit D_7 directly outputs the input output signal CK7 of the delay unit DU[7] to the count unit 14.

The count unit 14 performs a count operation based on the output signal CK7 of the delay unit DU[7] output from the latch circuit D_7 of the latch unit 13. In this count operation, a count value is increased or decreased by the rising or falling of the output signal CK7.

At a timing (second timing) at which a signal voltage of the analog signal Signal is approximately consistent with that of the ramp waves Ramp, an output signal CO of the comparison unit 11 is inverted, and the output signal Hold_L of the AND circuit AND1 of the signal generation unit 12 is in the high state. Thereby, the latch circuits D_0 to D_6 are in the enable state. After a time consistent with a delay time of the inverting delay circuit DLY of the signal generation unit 12 has elapsed from the second timing (third timing), the output signal xCO_D of the inverting delay circuit DLY of the signal generation unit 12 is inverted and the output signal Hold_L of the AND circuit AND1 of the signal generation unit 12 is in the low state. Thereby, the latch circuits D_0 to D_6 are in the disable state. At this time, the logic states corresponding to the output signals CK0 to CK6 of the delay units DU[0] to DU[6] are latched in the latch circuits D_0 to D_6. In addition, because the output signal Hold_C of the AND circuit AND2 of the latch unit 13 is in the low state at the third timing, the latch circuit D_7 is in the disable state and the logic state corresponding to the output signal CK7 of the delay unit DU[7] is latched in the latch circuit D_7.

The operation of the latch circuit D_7 is stopped and thus the count unit 14 latches a count value. Digital data corresponding to the analog signal Signal is obtained by the logic state latched by the latch unit 13 and the count value latched by the count unit 14.

In accordance with the AD conversion circuit according to the above-described example of the related art, current consumption of the latch unit can be reduced, and current consumption of the AD conversion circuit can be reduced, because the latch circuits D_0 to D_6 operate in only a period from the second timing to the third timing.

Because the signal Hold_L for controlling operations of the latch circuits D_0 to D_6 and the signal Hold_C for controlling the operation of the latch circuit D_7 are generated by separate AND circuits in the above-described AD conversion circuit of the related art, it is difficult to accurately latch an input signal, and there is a possibility of an error occurring in the AD conversion result and AD conversion accuracy being degraded if there is a deviation in the timing of switching between the high state and the low state between the signal Hold_L and the signal Hold_C due to variation in a delay of an input signal or a circuit threshold voltage in the AND circuits AND1 and AND2 and variation in an operation speed when an edge at which pulses of the output signals CK0 to CK7 of the delay units DU[0] to DU[7] are switched from the low state to the high state is close to the output signals CK6 and CK7.

Hereinafter, the case in which the AD conversion accuracy is degraded will be described. FIG. 10 illustrates the case in which operation timings of the AND circuit AND1, which outputs the signal Hold_L, and the AND circuit AND2, which outputs the signal Hold_C, are deviated by $\Delta t$. In this case, because a difference between the timing at which the signal Hold_L is switched from the high state to the low state and the timing at which the signal Hold_C is switched from the high state to the low state is $\Delta t$, a difference between the timing at which the latch circuits D_0 to D_6 latch the output signals CK0 to CK6 of the delay units DU[0] to DU[6] and the timing at which the latch circuit D_7 latches the output signal CK7 of the delay unit DU[7] is $\Delta t$.

Thereby, the latch result of the latch circuits D_0 to D_7 becomes a binary number $(10011100)_2$=(D_7=1, D_6=0, D_5=0, D_4=1, D_3=1, D_2=1, D_1=0, and D_0=0) ("0" corresponds to the low state and "1" corresponds to the high state). In this case, the number of positions of switching from 0 to 1 (or from 1 to 0) in the latch result of the latch circuits D_0 to D_7 is 2. On the other hand, when the latch circuit D_7 latches the output signal CK7 at the same timing as the latch circuits D_0 to D_6, the latch result of the latch circuits D_0 to D_7 becomes a binary number $(00011100)_2$=(D_7=0, D_6=0, D_5=0, D_4=1, D_3=1, D_2=1, D_1=0, and D_0=0). In this case, the number of positions of switching from 0 to 1 (or from 1 to 0) in the latch result of the latch circuits D_0 to D_7 is 1.

When an encoder which performs encoding according to a position of switching from 0 to 1 (or from 1 to 0) in the latch result of the latch circuits D_0 to D_7 is used, two switching positions are the cause of erroneous encoding, and an error of one or more least significant bits (LSB) is likely to occur.

SUMMARY

According to a first aspect of the present invention, an analog-to-digital (AD) conversion circuit may include: a comparison unit configured to receive an analog signal and a reference signal that increases or decreases with passage of time, the comparison unit being configured to compare voltages of the analog signal and the reference signal, the comparison unit being configured to output a first comparison signal at a first timing at which the voltages of the analog signal and the reference signal have a predetermined relationship; a signal generation unit configured to output a second comparison signal for switching a logic state at a second timing at which a predetermined time has elapsed from the first timing, the signal generation unit being configured to output a third comparison signal that is a result of a logic operation on the first comparison signal and the second comparison signal; a control unit configured to output an enable signal at least between a timing relating to a comparison start of the comparison unit and the second timing; a clock generation unit configured to output first to $n^{th}$ (n is a natural number equal to or greater than 2) clock signals having different phases; a latch unit that includes first to $n^{th}$ latch units, each of the first to $n^{th}$ latch units including an input terminal that receives a corresponding one of the first to $n^{th}$ clock signals, a first control terminal that receives the third comparison signal or the enable signal, a second control terminal that receives the second comparison signal, and an output terminal, each of the first to $n^{th}$ latch units latching a logic state of the one of the first to $n^{th}$ clock signals input to the input terminal; and a count unit configured to perform a count operation based on a signal from the output terminal of the $n^{th}$ latch unit, wherein each of first to $(n-k)^{th}$ (k is a natural number which is greater than or equal to 1 and less than or equal to n−1) latch units is in an enable state based on the third comparison signal, each of $(n-k+1)^{th}$ to $n^{th}$ latch units is in the enable state based on the enable signal, and each of the first to $n^{th}$ latch units latches each of the first to $n^{th}$ clock signals when the logic state of the second comparison signal is switched.

According to a second aspect of the present invention, in the AD conversion circuit according to the first aspect, each of the first to $n^{th}$ latch units may include: a logic circuit that includes a first input terminal connected to the input terminal and a second input terminal connected to the first control terminal; a first inverting circuit that is connected between the logic circuit and the output terminal; a second inverting circuit that is connected between the first inverting circuit and the output terminal; and a switch circuit that is connected to the second control terminal, the switch circuit being configured to connect the logic circuit, the first inverting circuit, and the second inverting circuit in series between the input terminal and the output terminal before the second comparison signal is input to the second control terminal, the switch circuit being configured to disconnect the logic circuit and the first inverting circuit and to connect the first inverting circuit and the second inverting circuit so that a signal output from one of the first inverting circuit and the second inverting circuit is input to the other of the first inverting circuit and the second inverting circuit after the second comparison signal has been input to the second control terminal, and wherein, when the third comparison signal of a high or low state has been input to the second input terminal, the logic state of the output terminal may be fixed to the high or low state regardless of a logic state of a clock signal input to the first input terminal.

According to a third aspect of the present invention, in the AD conversion circuit according to the first aspect, the signal generation unit may include: a comparison signal delay unit configured to output the second comparison signal obtained by delaying the first comparison signal by a predetermined time; and a first output unit configured to perform the logic operation on the first comparison signal and the second comparison signal, and output the third comparison signal.

According to a fourth aspect of the present invention, in the AD conversion circuit according to the first aspect, the enable signal may be a first enable signal, the AD conversion circuit may include a second output unit configured to be connected between the signal generation unit and one of the $(n-k+1)^{th}$ to $n^{th}$ latch units, the second output unit being configured to receive the first enable signal and the second comparison signal, the second output unit being configured to output a second enable signal that is a result of a logic operation on the first enable signal and the second comparison signal, and the second enable signal instead of the first enable signal may be input to the first control terminal in one of the $(n-k+1)^{th}$ to $n^{th}$ latch units connected to the second output unit.

According to a fifth aspect of the present invention, a solid-state image pickup device may include: an image pickup unit in which a plurality of pixels are arranged in a matrix shape, each of the plurality of pixels being configured to output a pixel signal according to an incident physical amount; and the AD conversion circuit according to claim 1 to which the analog signal corresponding to the pixel signal is input, wherein the comparison unit, the latch unit, the count unit, and the signal generation unit are arranged in every one or more columns of the pixels constituting the image pickup unit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

First Preferred Embodiment

Figure 1:
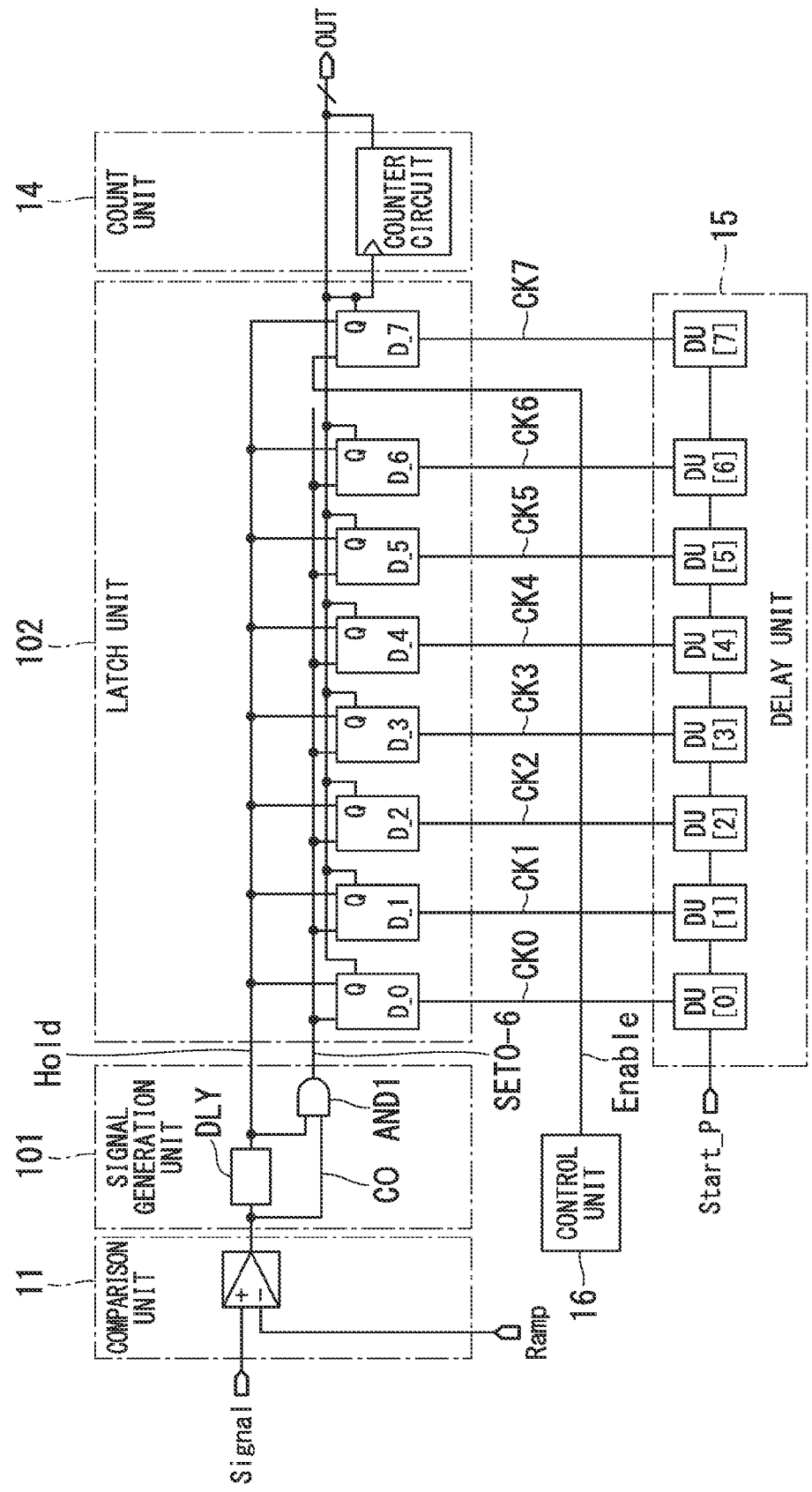
FIG. 1 is a block diagram illustrating a configuration of an AD conversion circuit in accordance with a first preferred embodiment of the present invention.

First, the first preferred embodiment of the present invention will be described. FIG. 1 illustrates an example of a configuration of an AD conversion circuit in accordance with the first preferred embodiment. Hereinafter, the configuration of this example will be described. The AD conversion circuit illustrated in FIG. 1 includes a comparison unit 11, a signal generation unit 101, a latch unit 102, a count unit 14, a delay unit 15, and a control unit 16.

The delay unit 15 (clock generation unit) has a plurality of delay units DU[0] to DU[7], each of which delays and outputs an input signal. The delay units DU[0] to DU[7] are connected in series in the order of the delay unit DU[0], the delay unit DU[1], the delay unit DU[2], . . . , and the delay unit DU[7]. A start pulse Start_P is input to the leading delay unit DU[0]. The delay unit DU[0] delays and outputs the input start pulse Start_P. Each of the delay units DU[1] to DU[7] delays and outputs an output signal of a previous-stage delay unit. Thereby, the delay units DU[0] to DU[7] output signals CK0 to CK7 which are clock signals with different phases, respectively.

Figure 2:
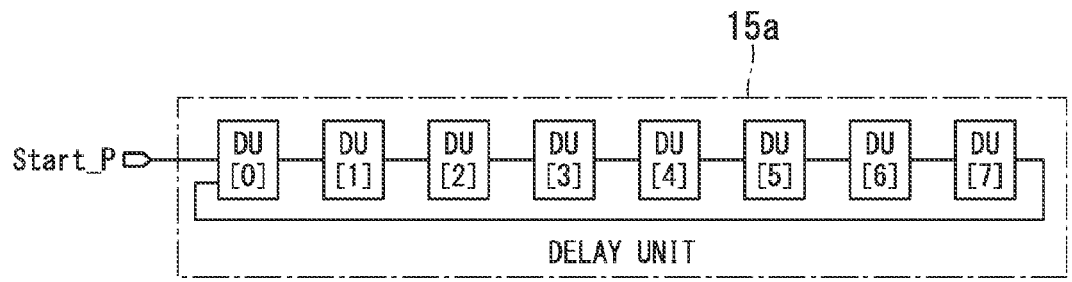
FIG. 2 is a block diagram illustrating a configuration of a delay unit provided in the AD conversion circuit in accordance with the first preferred embodiment of the present invention.

As the delay unit 15, an annular delay circuit implemented by connecting the plurality of delay units DU[0] to DU[7] in a ring shape may be used instead of the configuration illustrated in FIG. 1. FIG. 2 illustrates an example in which the delay unit is configured as the annular delay circuit. In a delay unit 15a, an output signal of the delay unit DU[7] is input to the delay unit DU[0]. The logic state of the start pulse Start_P changes from the low state to the high state and thus the delay unit 15a starts the operation.

The comparison unit 11 includes a voltage comparator which receives an analog signal Signal to be detected and a ramp wave Ramp, which increases or decreases with the passage of time, and outputs an output signal CO (first comparison signal) indicating a result obtained by comparing the analog signal Signal to the ramp waves Ramp. Thereby, a time interval corresponding to the analog signal Signal is generated.

The signal generation unit 101 generates a control signal for controlling operations of the latch unit 102 and the count unit 14. The signal generation unit 101 includes an inverting delay circuit DLY (comparison signal delay unit) that inverts and delays the output signal CO of the comparison unit 11, and an AND circuit AND1 (first output unit) that outputs an output signal SET0-6 (third comparison signal) obtained by performing an AND operation on an output signal Hold (second comparison signal) of the inverting delay circuit DLY and the output signal CO of the comparison unit 11. Details will be described later. Through the above configuration, the signal generation unit 101 generates a control signal for setting latch circuits D_0 to D_6 of the latch unit 102 to an enable (valid) state at a first timing after the start pulse (=Start_P) has been input and causing the latch circuits D_0 to D_7 and the count unit 14 to execute a latch at a second timing at which a predetermined time has elapsed from the first timing.

The latch unit 102 includes the latch circuits D_0 to D_7 (latch units) which latch logic states of the output signals CK0 to CK7 of the delay unit 15. The count unit 14 includes a counter circuit which performs a count operation based on the output signal CK7 from the delay unit 15. The control unit 16 outputs a control signal Enable (enable signal) to the latch unit 102. The control signal Enable is a signal for controlling the latch circuit D_7.

Figure 3:
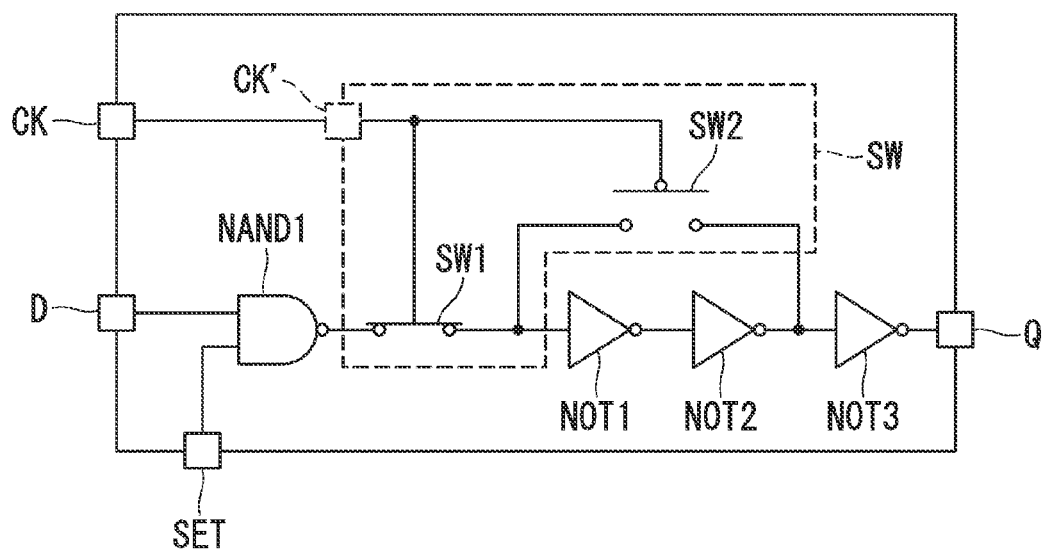
FIG. 3 is a circuit diagram illustrating a configuration of a latch circuit constituting a latch unit provided in the AD conversion circuit in accordance with the first preferred embodiment of the present invention.

The latch circuits D_0 to D_7 constituting the latch unit 102 will be described. FIG. 3 illustrates an example of a configuration of the latch circuits D_0 to D_7 in accordance with the first preferred embodiment. The latch circuits D_0 to D_7 illustrated in FIG. 3 include a NAND circuit NAND1 (logic circuit), an inverting circuit NOT1 (first inverting circuit), an inverting circuit NOT2 (second inverting circuit), an inverting circuit NOT3, and a switch circuit SW. Further, the switch circuit SW includes switch circuits SW1 and SW2.

One input terminal (first input terminal) of the NAND circuit NAND1 is connected to an input terminal D. The other input terminal (second input terminal) of the NAND circuit NAND1 is connected to an input terminal SET (first control terminal). One end of the switch circuit SW1 is connected to an output terminal of the NAND circuit NAND1. The other end of the switch circuit SW1 is connected to the input terminal of the inverting circuit NOT1 and one end of the switch circuit SW2. An input terminal of the inverting circuit NOT2 is connected to an output terminal of the inverting circuit NOT1.

The other end of the switch circuit SW2 is connected to an output terminal of the inverting circuit NOT2 and an input terminal of the inverting circuit NOT3. An output terminal of the inverting circuit NOT3 is connected to an output terminal Q. Here, although the inverting circuit NOT3 is used in the latch circuits D_0 to D_7 so as to output signals of the same logic states as the logic states of the input signals of the latch circuits D_0 to D_7 in the first preferred embodiment, the present invention is not limited thereto. The inverting circuit NOT3 is arranged in a stage subsequent to the latch circuits D_0 to D_7, and signal processing may be performed by inverting output signals of the latch circuits D_0 to D_7 in the inverting circuit NOT3 in a stage subsequent to the latch circuits D_0 to D_7.

Because the output signal of the NAND circuit NAND1 is in the high state regardless of a logic state of an input signal of an input terminal D when input signals of input terminals SET of the latch circuits D_0 to D_7 are in the low state, the latch circuits D_0 to D_7 are in the disable state. Because the NAND circuit NAND1 inverts the logic state of the input signal of the input terminal D and outputs the inverted logic state when the input signals of the input terminals SET of the latch circuits D_0 to D_7 are in the high state, the latch circuits D_0 to D_7 are in the enable state. Also, although the NAND circuit NAND1 is used to control the enable state and the disable state of the latch circuits D_0 to D_7 in the first preferred embodiment, the present invention is not limited thereto, and an AND circuit, an OR circuit, or a NOR circuit may be used. That is, it is only necessary for the logic state of an output terminal Q to be either high or low regardless of the logic state of the input terminal D when a high or low logic state has been input to the input terminal SET.

A control terminal CK' of the switch circuits SW1 and SW2 is connected to an input terminal CK (second control terminal), and the switch circuits SW1 and SW2 are controlled through an input signal of the input terminal CK. The switch circuit SW1 is turned ON when the input signal of the input terminal CK is in the high state, and turned OFF when the input signal of the input terminal CK is in the low state. The switch circuit SW2 is turned ON when the input signal of the input terminal CK is in the low state, and turned OFF when the input signal of the input terminal CK is in the high state.

Signals input to the input terminals CK of the latch circuits D_0 to D_6 are an output signal Hold of the signal generation unit 101, and a signal input to the input terminal SET is an output signal SET0-6 of the signal generation unit 101. When the output signal SET0-6 of the signal generation unit 101 is in the high state, the latch circuits D_0 to D_6 are in the enable state. When the output signal Hold of the signal generation unit 101 in the enable state is in the high state, the output signals CK0 to CK6 of the delay units DU[0] to DU[6] are directly output. When the output signal Hold of the signal generation unit 101 transitions from the high state to the low state, the latch circuits D_0 to D_6 latch logic states corresponding to the output signals CK0 to CK6 of the delay units DU[0] to DU[6] at that time. When the output signal SET0-6 of the signal generation unit 101 transitions from the high state to the low state, the latch circuits D_0 to D_6 are in the disable state.

On the other hand, the signal input to the input terminal CK of the latch circuit D_7 is the output signal Hold of the signal generation unit 101, and the signal input to the input terminal SET is the control signal Enable. When the control signal Enable is in the high state, the latch circuit D_7 is in the enable state. When the output signal Hold of the signal generation unit 101 is in the high state in a state in which the latch circuit D_7 is in the enable state, the output signal CK7 of the delay unit DU[7] is directly output. When the output signal Hold of the signal generation unit 101 transitions from the high state to the low state, the latch circuit D_7 latches the logic state corresponding to the output signal CK7 of the delay unit DU[7]. When the control signal Enable transitions from the high state to the low state, the latch circuit D_7 is in the disable state.

Although no count latch circuit which latches the logic state of the count result of the count unit 14 is explicitly illustrated in FIG. 1, a counter circuit having a latch function is used and hence the counter circuit also serves as the count latch circuit. Further, this configuration is only exemplary and the present invention is not limited thereto.

Figure 4:
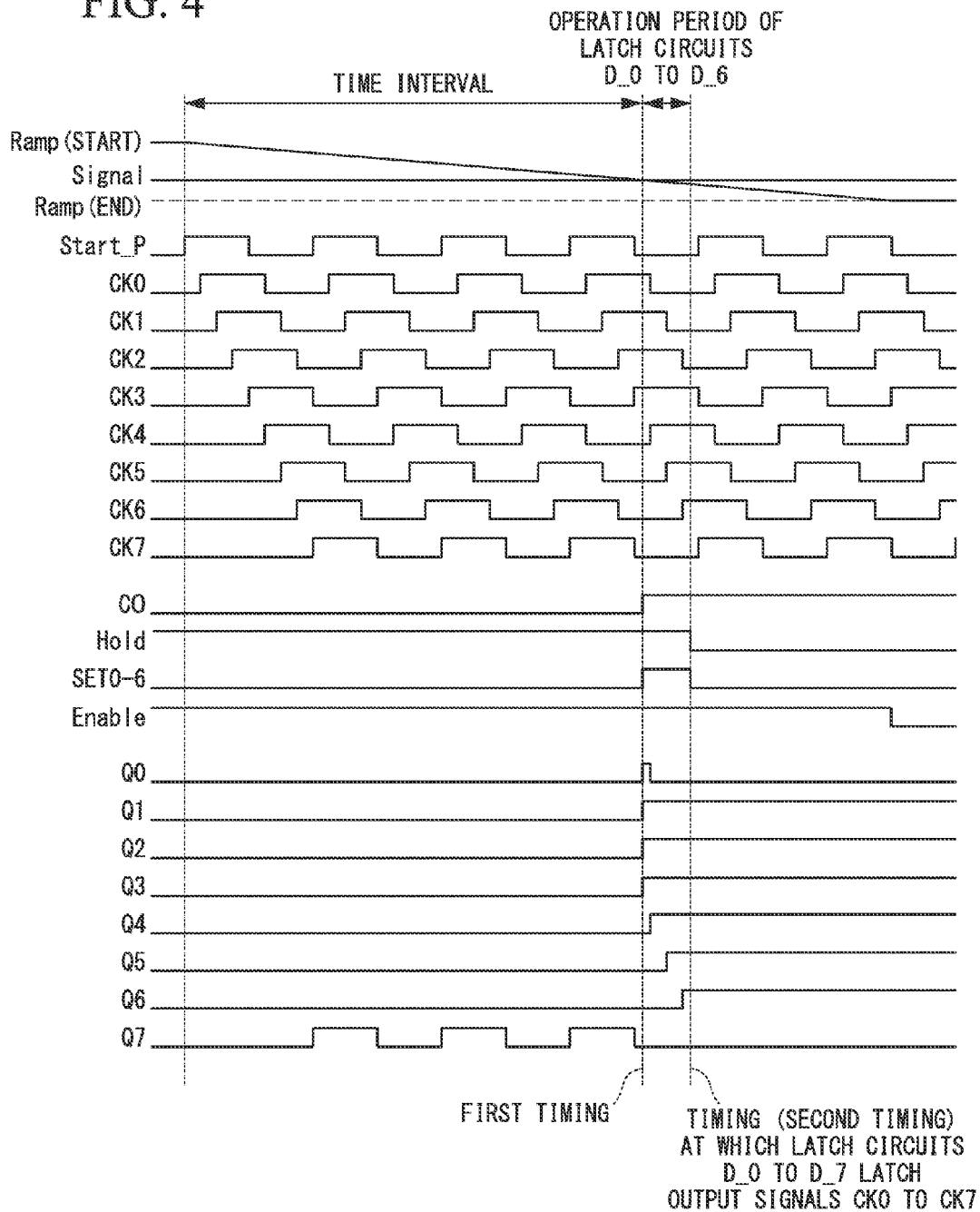
FIG. 4 is a timing chart illustrating an operation of the AD conversion circuit in accordance with the first preferred embodiment of the present invention.

Next, an operation of the first preferred embodiment will be described. FIG. 4 illustrates the operation of the AD conversion circuit in accordance with the first preferred embodiment. In FIG. 4, Q0 to Q7 denote signals output from the latch circuits D_0 to D_7.

First, at a timing relating to a comparison start in the comparison unit 11, a clock having a cycle approximately consistent with a delay time (a sum of delay times of 8 delay units DU[0] to DU[7]) of the delay unit 15 is input as the start pulse (=Start_P). Thereby, the operation of the delay unit 15 is started. The delay unit DU[0] constituting the delay unit 15 outputs the output signal CK0 by delaying the start pulse (=Start_P), and the delay units DU[1] to DU[7] constituting the delay unit 15 output the output signals CK1 to CK7 by delaying respective outputs of previous-stage delay units. The output signals CK0 to CK7 of the delay units DU[0] to DU[7] are input to the latch circuits D_0 to D_7 of the latch unit 102, respectively. Because the output signal CO of the comparison unit 11 input to the inverting delay circuit DLY is in the low state, the output signal Hold of the inverting delay circuit DLY is in the high state, and the output signal SET0-6 of the AND circuit AND1 of the signal generation unit 101 is in the low state, the latch circuits D_0 to D_6 are in the disable state and operations thereof are stopped.

On the other hand, because the output signal Hold of the inverting delay circuit DLY is in the high state and the control signal Enable is in the high state, the latch circuit D_7 is in the enable state and the output signal CK7 of the delay unit DU[7] is directly output.

The count unit 14 performs a count operation based on the output signal CK7 of the delay unit 15 output from the latch circuit D__7. In the count operation, a count value is increased or decreased at the rising or falling of the output signal CK7. When a signal voltage corresponding to ramp waves Ramp is greater than a signal voltage corresponding to an analog signal Signal after an operation of the delay unit 15 has been started, the output signal CO of the comparison unit 11 is in the low state. When a signal voltage corresponding to the ramp waves Ramp is less than or equal to a signal voltage corresponding to the analog signal Signal, the output signal CO of the comparison unit 11 is in the high state (first timing). A period from a point in time relating to the start of the comparison process of the comparison unit 11 to a point in time at which the output signal CO of the comparison unit 11 is in the high state is a time interval to be detected. The number of passages of the start pulse Start_P through the delay units DU[0] to DU[7] constituting the delay unit 15 within the above-described period becomes a number corresponding to a level of the analog signal Signal.

At a first timing at which the output signal CO of the comparison unit 11 is inverted, the output signal SET0-6 of the AND circuit AND1 of the signal generation unit 101 is in the high state. Thereby, the latch circuits D__0 to D__6 are in the enable state. After a time consistent with a delay time of the inverting delay circuit DLY of the signal generation unit 101 has elapsed from the first timing (second timing), the output signal Hold of the inverting delay circuit DLY of the signal generation unit 101 is inverted and has the low state. At this time, logic states corresponding to the output signals CK0 to CK7 of the delay units DU[0] to DU[7] are latched in the latch circuits D__0 to D__7 of the latch unit 102. In addition, the output signal Hold of the inverting delay circuit DLY of the signal generation unit 101 is in the low state, and thus the output signal SET0-6 of the AND circuit AND1 of the signal generation unit 101 is in the low state. Thereby, the latch circuits D__0 to D__6 are in the disable state.

The latch circuit D__7 latches the output signal CK7 and hence the count unit 14 latches a count value. Data corresponding to the time interval is obtained by the logic state latched by the latch unit 102 and the count value latched by the count unit 14. The latched data, for example, is output to a subsequent-stage arithmetic unit (not illustrated), and a process such as binarization is performed.

After the time consistent with an AD conversion period has elapsed, the control signal Enable is in the low state. Thereby, the latch circuit D__7 is in the disable state.

As described above, according to the configuration illustrated in FIG. 1, because the output signal Hold for controlling the latch operations of the latch circuits D__0 to D__7 is generated by the AND circuit AND1 of the signal generation unit 101, it is possible to prevent the AD conversion accuracy from being degraded without a deviation in the timing at which the output signals CK0 to CK7 of the delay units DU[0] to DU[7] are latched between the latch circuits D__0 to D__6 and the latch circuit D__7.

Although the transition of the enable state/disable state of the latch circuits D 0 to D__6 is controlled by the output signal SET0-6 of the AND circuit AND1 of the signal generation unit 101 and the transition of the enable state/disable state of the latch circuit D__7 is controlled by the control signal Enable in the first preferred embodiment, the present invention is not limited thereto. For example, the AD conversion circuit may be configured so that the transition of the enable state/disable state of the latch circuits D__1 to D__5 is controlled by the output signal SET0-6 of the AND circuit AND1 of the signal generation unit 101 and the transition of the enable state/disable state of the latch circuits D__0, D__6, and D__7 is controlled by the control signal Enable.

In addition, although the latch circuits D__0 to D__7 of the first preferred embodiment are configured as illustrated in FIG. 3, the present invention is not limited thereto. It is only necessary to configure the latch circuits D__0 to D__7 so that the enable state and the disable state of the latch circuits D__0 to D__7 can be controlled according to the signal input to the input terminal SET and the signal input to an input terminal D is latched according to the signal input to the input terminal CK.

In addition, although the output signal SET0-6 of the first preferred embodiment is generated using the AND circuit, the present invention is not limited thereto. A NAND circuit, an OR circuit, a NOR circuit, or an XOR circuit may be used according to the configuration of the signal generation unit or the latch circuit. That is, a circuit for outputting a signal for setting the latch circuits D__0 to D__6 to the enable state/disable state may have two input terminals. It is only necessary to set the latch circuits D__0 to D__6 to the enable state when the logic state of the one input terminal is changed from the high or low state to a state different therefrom and then set the latch circuits D__0 to D__6 to the disable state when the logic state of the other input terminal is changed from the high or low state to a state different therefrom.

Second Preferred Embodiment

Figure 5:
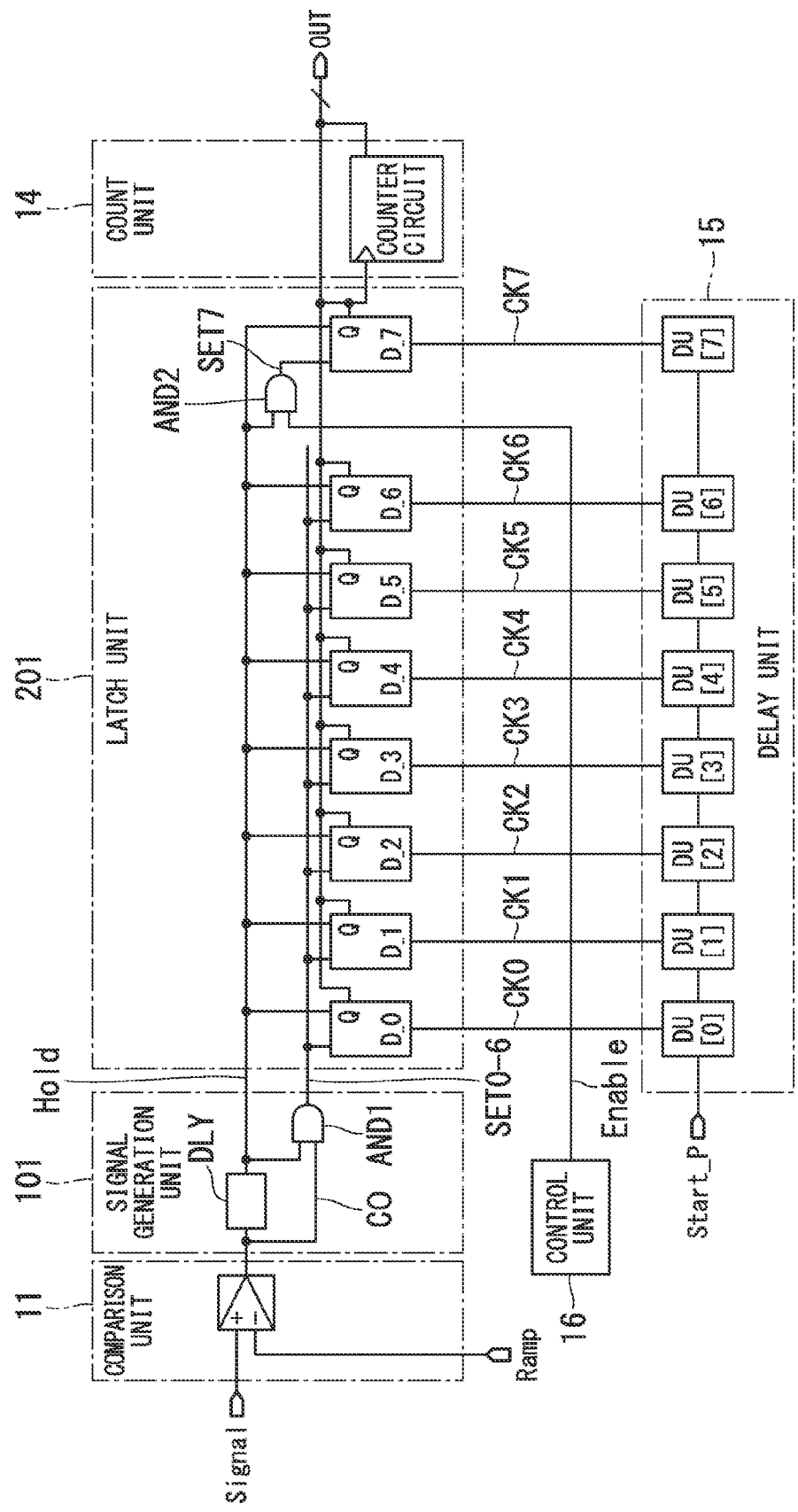
FIG. 5 is a block diagram illustrating a configuration of an AD conversion circuit in accordance with a second preferred embodiment of the present invention.

Next, the second preferred embodiment of the present invention will be described. FIG. 5 illustrates an example of a configuration of an AD conversion circuit in accordance with the second preferred embodiment. The same components as those used in FIG. 1 among components used in FIG. 5 are assigned the same reference signs, and description thereof is omitted. Hereinafter, a configuration and an operation of the second preferred embodiment will be described based on differences from the first preferred embodiment. A difference from the configuration illustrated in FIG. 1 is that a latch unit 201 is provided instead of the latch unit 102.

The latch unit 201 includes a latch circuit D__0 to D__7 that latches logic states of output signals CK0 to CK7 of a delay unit 15, and an AND circuit AND2 (second output unit) that outputs a signal SETT (second enable signal) obtained by performing an AND operation on an output signal Hold of a signal generation unit 101 and a control signal Enable (first enable signal). Through this configuration, the signal generation unit 101 and the AND circuit AND2 generate a control signal for simultaneously setting the latch circuits D__0 to D__7 to the disable state. Because the other elements are same as those of FIG. 1, description thereof is omitted.

Figure 6:
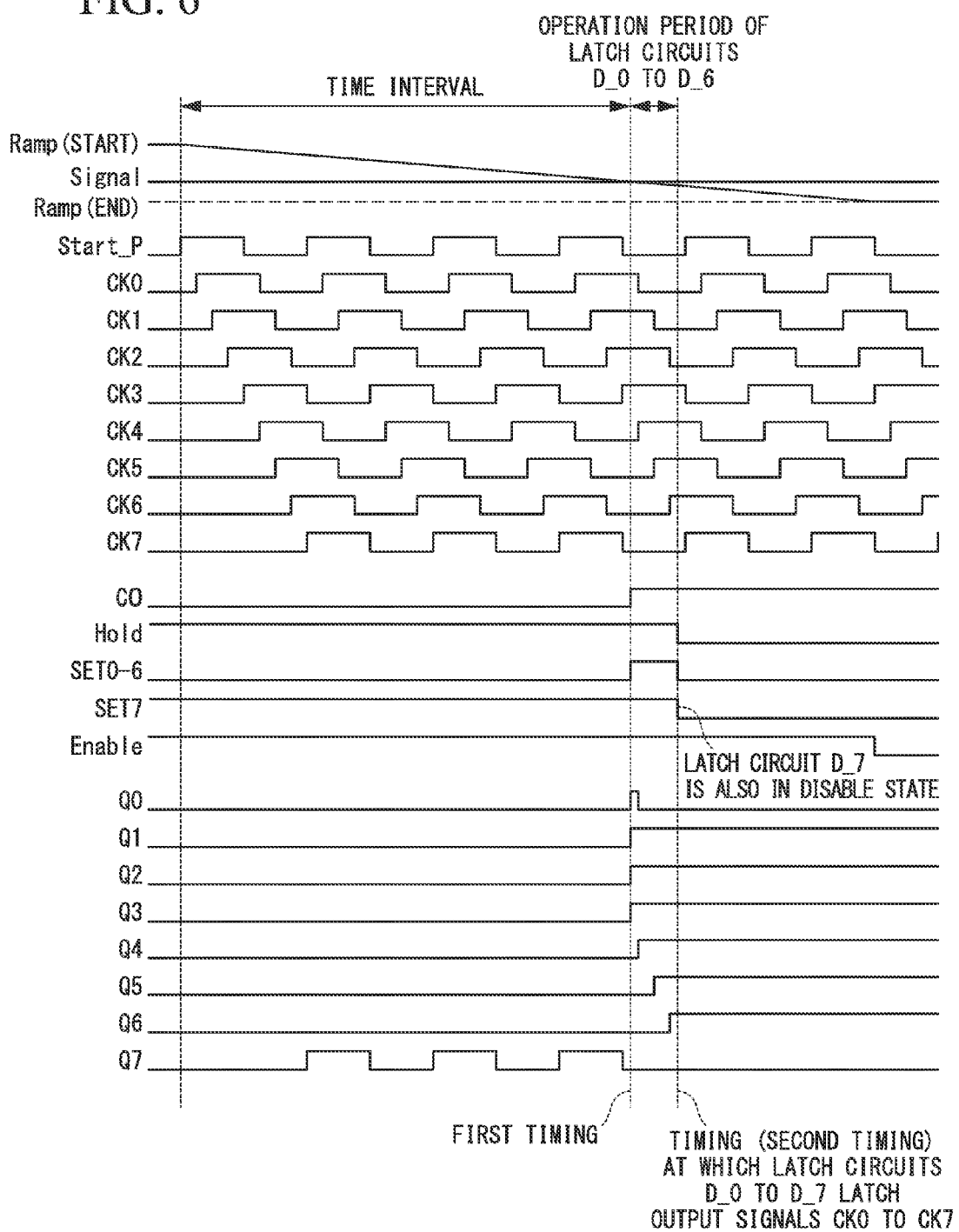
FIG. 6 is a timing chart illustrating an operation of the AD conversion circuit in accordance with the second preferred embodiment of the present invention.

Next, an operation of the second preferred embodiment will be described. FIG. 6 illustrates the operation of the AD conversion circuit in accordance with the second preferred embodiment. In FIG. 6, Q0 to Q7 denote signals output from the latch circuits D__0 to D__7.

First, at a timing relating to a comparison start in the comparison unit 11, a clock having a cycle approximately consistent with a delay time (a sum of delay times of 8 delay units DU[0] to DU[7]) of the delay unit 15 is input as the start pulse (=Start_P). Thereby, the operation of the delay unit 15 is started. The delay unit DU[0] constituting the delay unit 15 outputs the output signal CK0 by delaying the start pulse (=Start_P), and the delay units DU[1] to DU[7] constituting the delay unit 15 output the output signals CK1 to CK7 by delaying the output signals of previous-stage delay units, respectively. The output signals CK0 to CK7 of the delay units DU[0] to DU[7] are input to the latch circuits D__0 to D_7 of the latch unit 102, respectively. Because the input signal CO of the inverting delay circuit DLY is in the low state, the output signal Hold of the inverting delay circuit DLY is in the high state, and the output signal SET0-6 of the AND circuit AND1 of the signal generation unit 101 is in the low state, the latch circuits D_0 to D_6 are in the disable state and operations thereof are stopped.

On the other hand, because the output signal Hold of the inverting delay circuit DLY is in the high state and the control signal Enable is in the high state, the latch circuit D_7 is in the enable state and the output signal CK7 of the delay unit DU[7] is directly output.

The count unit 14 performs a count operation based on the output signal CK7 of the delay unit 15 output from the latch circuit D_7. In the count operation, a count value is increased or decreased at the rising or falling of the output signal CK7.

When a signal voltage corresponding to ramp waves Ramp is greater than a signal voltage corresponding to a signal Signal after an operation of the delay unit 15 has been started, the output signal CO of the comparison unit 11 is in the low state. When the signal voltage corresponding to the ramp waves Ramp is less than or equal to the signal voltage corresponding to the signal Signal, the output signal CO of the comparison unit 11 is in the high state (first timing). A period from a point in time relating to the start of the comparison process of the comparison unit 11 to a point in time at which the output signal CO of the comparison unit 11 is in the high state becomes a time interval to be detected. The number of passages of the start pulse Start_P through the delay units DU[0] to DU[7] constituting the delay unit 15 within the above-described period becomes a number corresponding to a level of the analog signal Signal.

At a first timing at which the output signal CO of the comparison unit 11 is inverted, the output signal SET0-6 of the AND circuit AND1 of the signal generation unit 101 is in the high state. Thereby, the latch circuits D_0 to D_6 are in the enable state. After a time consistent with a delay time of the inverting delay circuit DLY of the signal generation unit 101 has elapsed from the first timing (second timing), the output signal Hold of the inverting delay circuit DLY of the signal generation unit 101 is inverted and has the low state. At this time, logic states corresponding to the output signals CK0 to CK7 of the delay units DU[0] to DU[7] are latched in the latch circuits D_0 to D_7 of the latch unit 201. In addition, the output signal Hold of the inverting delay circuit DLY of the signal generation unit 101 is in the low state, and thus the output signal SET0-6 of the AND circuit AND1 of the signal generation unit 101 and the output signal SET7 of the AND circuit AND2 of the latch unit 201 is in the low state. Thereby, the latch circuits D_0 to D_7 are in the disable state.

The latch circuit D_7 latches the output signal CK7 and hence the count unit 14 latches a count value. Data corresponding to the time interval is obtained by the logic state latched by the latch unit 201 and the count value latched by the count unit 14. The latched data, for example, is output to a subsequent-stage arithmetic unit (not illustrated), and a process such as binarization is performed. After a predetermined AD conversion period has elapsed, the control signal Enable is in the low state.

As described above, according to the configuration illustrated in FIG. 5, because the output signal Hold for controlling the latch operations of the latch circuits D_0 to D_7 is generated by the AND circuit AND1 of the signal generation unit 101, it is possible to prevent the AD conversion accuracy from being degraded without a deviation in the timing at which the output signals CK0 to CK7 of the delay units DU[0] to DU[7] are latched between the latch circuits D_0 to D_6 and the latch circuit D_7.

In addition, it is possible to further reduce power consumption relating to the operation of the latch circuit D_7 in the second preferred embodiment compared to the first preferred embodiment because the latch circuit D_7 is in the disable state and its operation is stopped immediately after the latch circuit D_7 has latched the output signal CK7 of the delay unit DU[7].

Also, although the transition of the enable state/disable state of the latch circuits D_0 to D_6 is controlled by the output signal SET0-6 of the AND circuit AND1 of the signal generation unit 101 and the transition of the enable state/disable state of the latch circuit D_7 is controlled by the output signal SET7 of the AND circuit AND2 of the latch unit 201 in the second preferred embodiment, the present invention is not limited thereto. For example, the AD conversion circuit may be configured so that the transition of the enable state/disable state of the latch circuits D_1 to D_5 is controlled by the output signal SET0-6 of the AND circuit AND1 of the signal generation unit 101 and the transition of the enable state/disable state of the latch circuits D_0, D_6, and D_7 is controlled by the output signal SET7 of the AND circuit AND2 of the latch unit 201.

In addition, although the latch circuits D_0 to D_7 of the second preferred embodiment are configured as illustrated in FIG. 3, the present invention is not limited thereto. It is only necessary to configure the latch circuits D_0 to D_7 so that the enable state and the disable state of the latch circuits D_0 to D_7 can be controlled according to the signal input to the input terminal SET and the signal input to an input terminal D is latched according to the signal input to the input terminal CK.

In addition, although the output signals SET0-6 and SET7 of the second preferred embodiment are generated using the AND circuit, the present invention is not limited thereto. A NAND circuit, an OR circuit, a NOR circuit, or an XOR circuit may be used according to the configuration of the signal generation unit or the latch circuit. That is, a circuit for outputting a signal for setting the latch circuits D_0 to D_7 to the enable state/disable state may have two input terminals. It is only necessary to set the latch circuits D_0 to D_7 to the enable state when the logic state of the one input terminal is changed from the high or low state to a state different therefrom and then set the latch circuits D_0 to D_7 to the disable state when the logic state of the other input terminal is changed from the high or low state to a state different therefrom.

Third Preferred Embodiment

Figure 7:
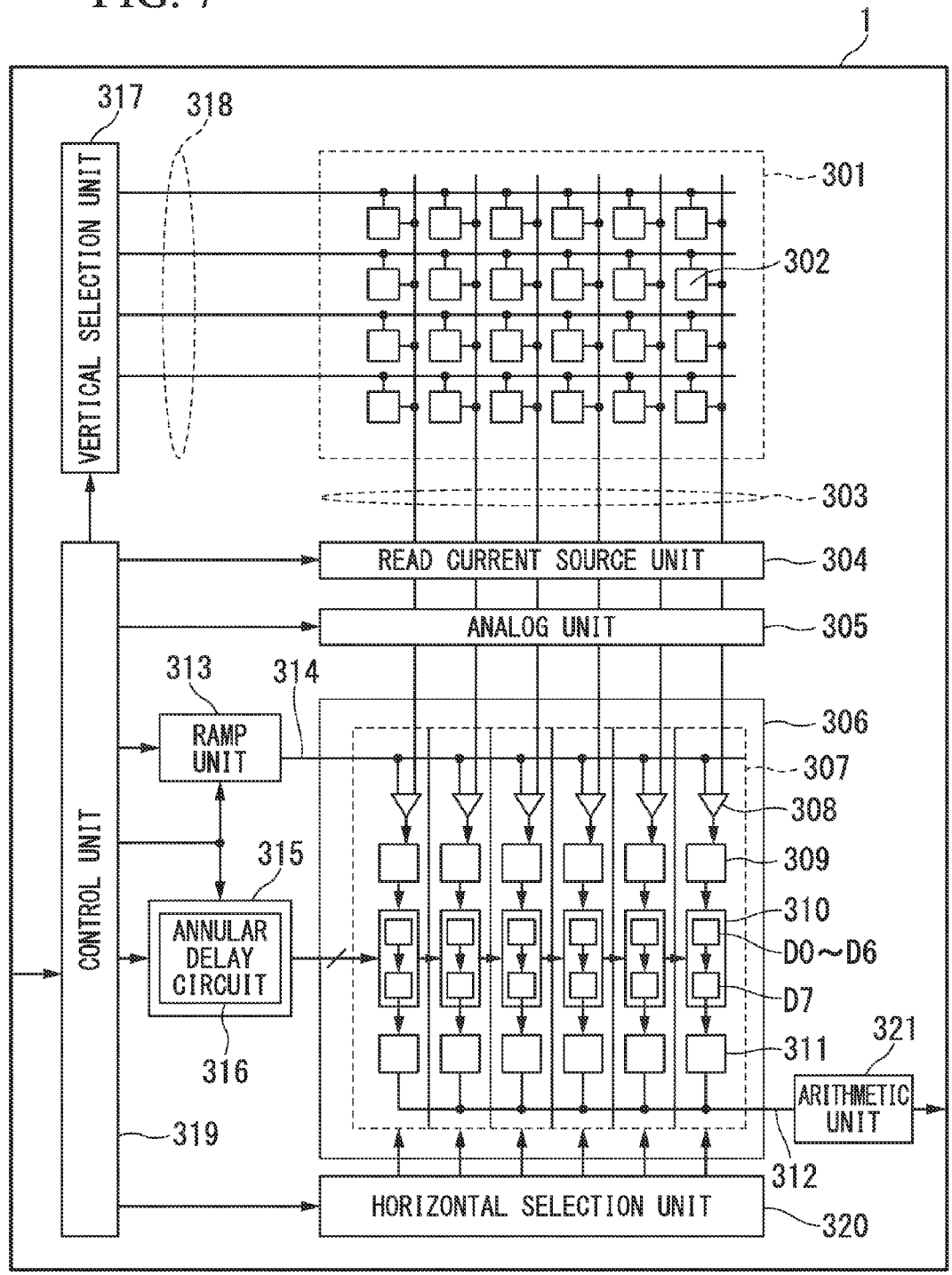
FIG. 7 is a block diagram illustrating a configuration of a solid-state image pickup device in accordance with a third preferred embodiment of the present invention.
Figure 8:
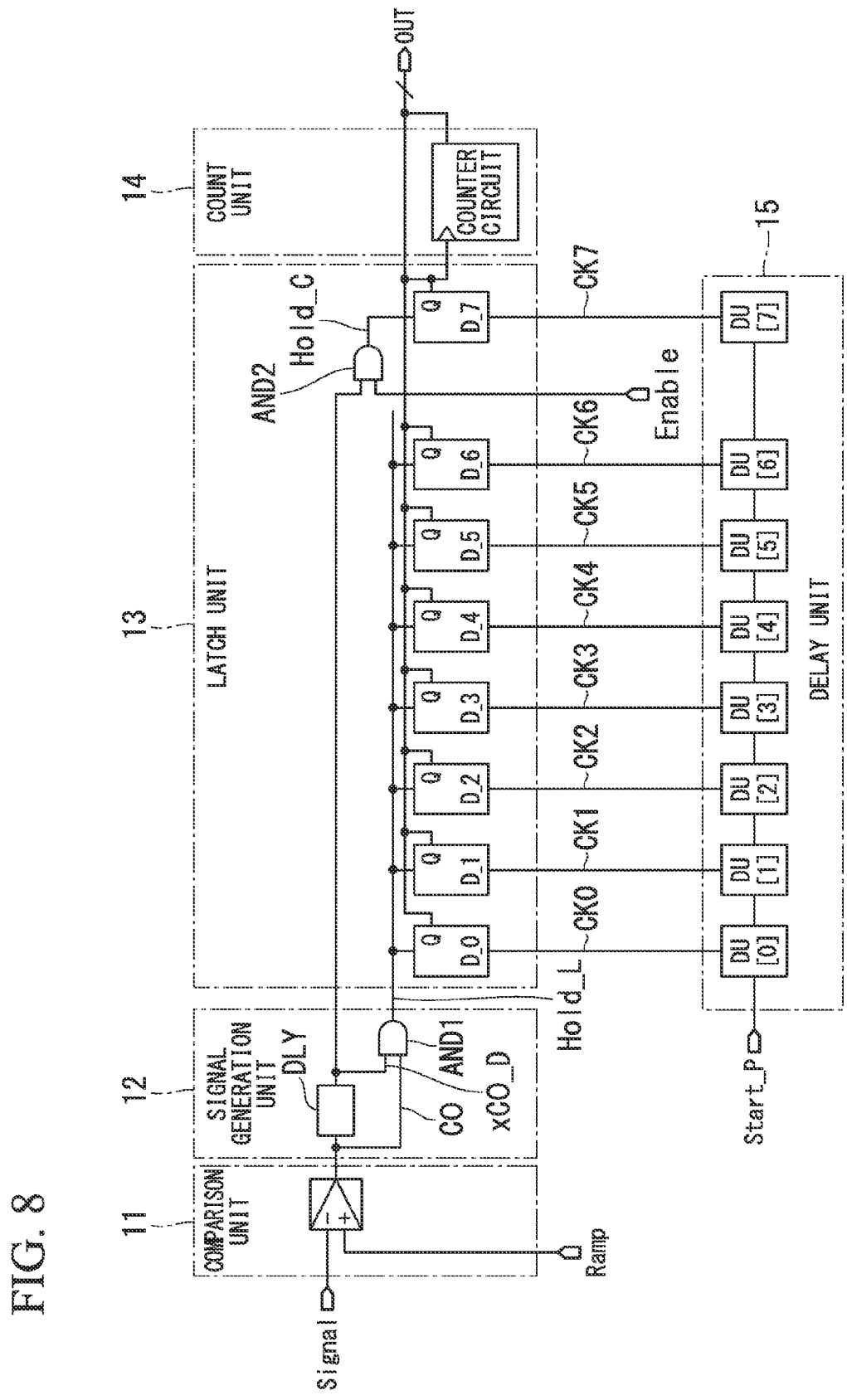
FIG. 8 is a block diagram illustrating a configuration of an AD conversion circuit of the related art.
Figure 9:
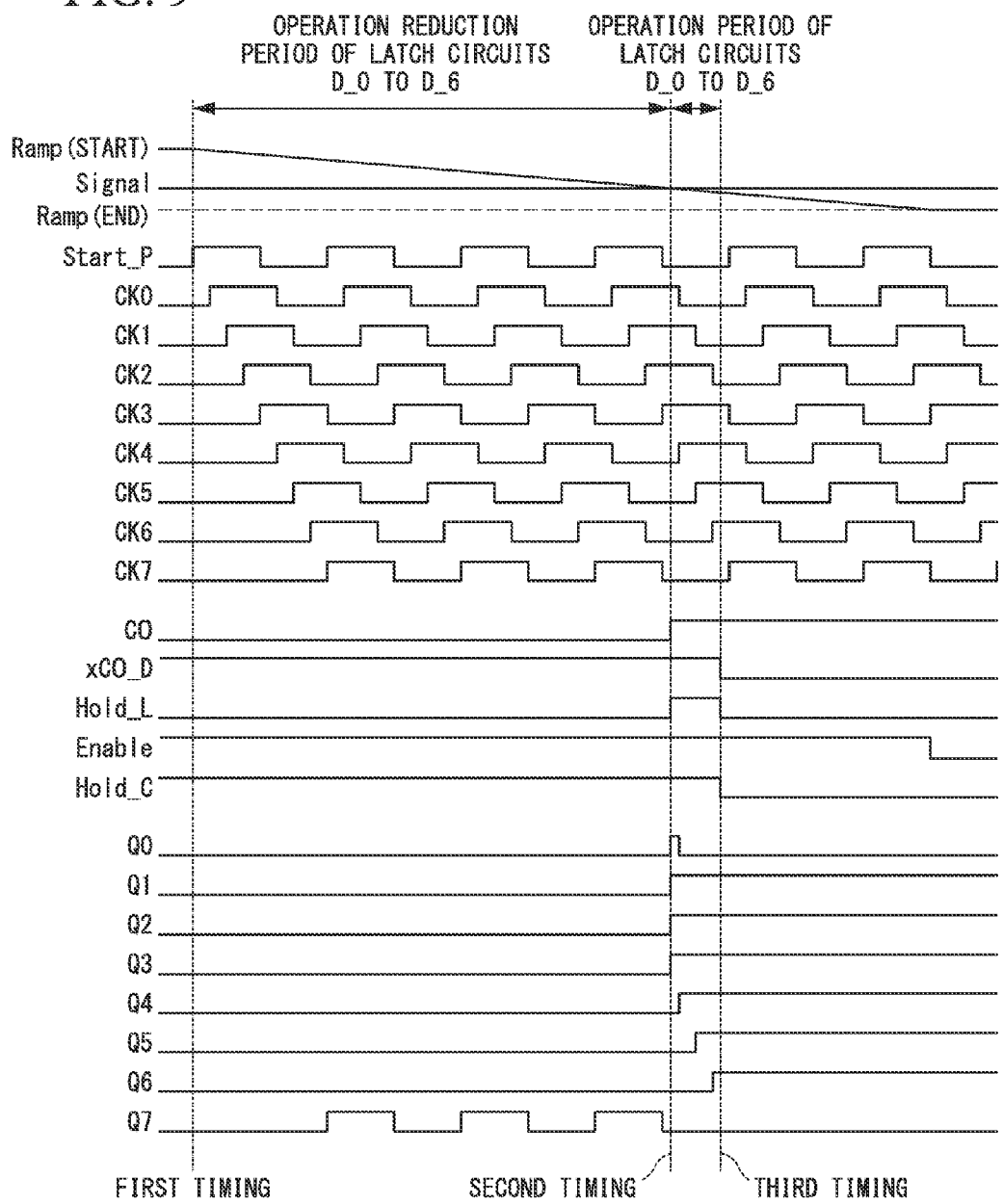
FIG. 9 is a timing chart illustrating an operation of the AD conversion circuit of the related art.
Figure 10:
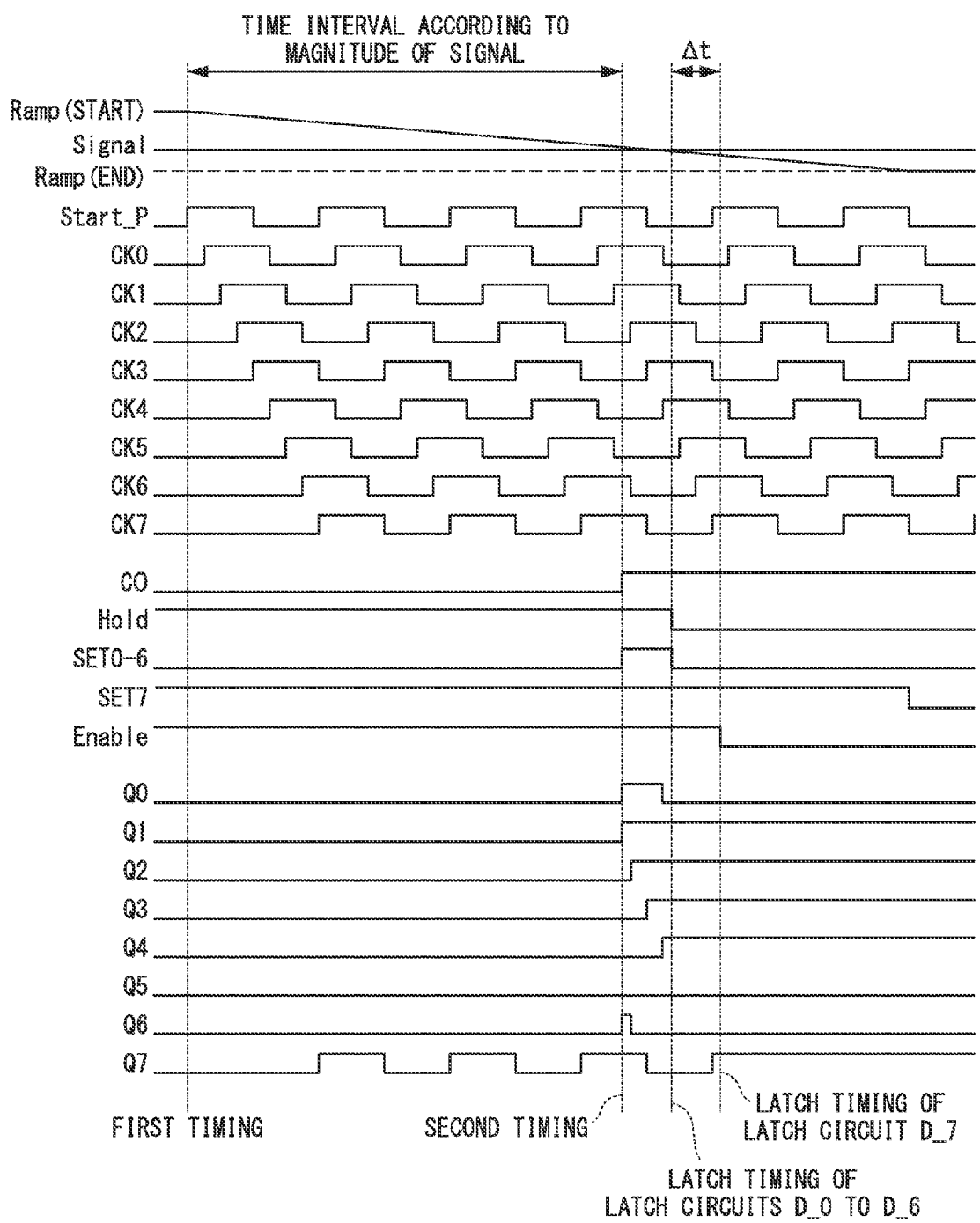
FIG. 10 is a timing chart illustrating an operation of the AD conversion circuit of the related art.

Next, the third preferred embodiment of the present invention will be described. FIG. 7 illustrates an example of a configuration of a solid-state image pickup device in accordance with the third preferred embodiment. Hereinafter, a configuration diagram of this example will be described. A solid state image pickup device 1 illustrated in FIG. 7 includes an image pickup unit 301, a read current source unit 304, an analog unit 305, a column processing unit 306, an arithmetic unit 321, a ramp unit 313, a delay unit 315, a vertical selection unit 317, a control unit 319, and a horizontal selection unit 320.

In the image pickup unit 301, a plurality of unit pixels 302, each of which generates and outputs a signal corresponding to an amount of incident electromagnetic waves, are arranged in a matrix shape. The vertical selection unit 317 selects each row of the image pickup unit 301. The read current source unit 304 reads a signal from the image pickup unit 301 as a voltage signal. The analog unit 305 includes a CDS circuit and the like and performs analog processing on the signal read from the image pickup unit 301. The delay unit 315 corresponds to the delay unit 15 described in the first and second preferred embodiments, and has an annular delay circuit 316. The ramp unit 313 generates ramp waves as a reference signal that increases or decreases with the passage of time. The column processing unit 306 is connected to the ramp unit 313 via a reference signal line 314. The horizontal selection unit 320 reads data generated by the column processing unit 306 to a horizontal signal line 312.

The arithmetic unit 321 is connected to the horizontal signal line 312. The control unit 319 controls each unit, and includes the functions of the control unit 16 of the above-described first and second preferred embodiments.

Although the image pickup unit 301 including unit pixels 302 of 4 rows×6 columns has been described with reference to FIG. 7 for simplicity, several tens to several tens of thousands of unit pixels 302 are actually arranged in each row or column of the image pickup unit 301. Although not illustrated, the unit pixels 302 constituting the image pickup unit 301 include a photoelectric conversion element such as a photodiode/photogate/phototransistor and a transistor circuit.

In this system configuration, a peripheral driving system and a peripheral signal processing system for controlling driving of each of the unit pixels 302 of the image pickup unit 301, that is, peripheral circuits such as the vertical selection unit 317, the horizontal selection unit 320, the column processing unit 306, the arithmetic unit 321, the delay unit 315, the ramp unit 313, and the control unit 319, are integrally formed in a semiconductor area such as single crystal silicon or the like along with the image pickup unit 301 using technology similar to technology for manufacturing a semiconductor integrated circuit.

Hereinafter, the respective units will be described in further detail. In the image pickup unit 301, the unit pixels 302 are two-dimensionally arranged only in 4 rows and 6 columns, and a row control line 318 is wired for every row with respect to a pixel array of 4 rows and 6 columns. One end of the row control line 318 is connected to an output end corresponding to each row of the vertical selection unit 317. The vertical selection unit 317 includes a shift register or a decoder. The vertical selection unit 317 controls row addressing or row scanning of the image pickup unit 301 via the row control line 318 when each unit pixel 302 of the image pickup unit 301 is driven. In addition, a vertical signal line 303 is wired for every column with respect to the pixel array of the image pickup unit 301.

The read current source unit 304, for example, is configured using an n-channel metal-oxide-semiconductor (NMOS) transistor. The vertical signal line 303 from the image pickup unit 301 is connected to a drain terminal of the NMOS transistor constituting the read current source unit 304. A desired voltage is appropriately applied to a control terminal, and a source terminal is connected to the ground (GND). Thereby, a signal from the unit pixel 302 is output as a voltage mode. Further, although the case in which the NMOS transistor is used as a current source has been described, the present invention is not limited thereto.

Although not described in detail, the analog unit 305 removes a noise component referred to as fixed pattern noise (FPN), which is fixed variation for every pixel, or reset noise by processing a difference between a signal level (reset level) immediately after pixel reset and a true signal level with respect to a pixel signal of the voltage mode input via the vertical signal line 303. Further, if necessary, an auto gain control (AGC) circuit having a signal amplification function or the like may be provided.

The column processing unit 306, for example, has an AD conversion (ADC) unit 307 provided for every pixel column of the image pickup unit 301, that is, every vertical signal line 303. The column processing unit 306 converts an analog pixel signal read from each unit pixel 302 of the image pickup unit 301 through the vertical signal line 303 for every pixel column into digital data. Further, although the ADC units 307 are arranged to have a one-to-one correspondence relationship with pixel columns of the image pickup unit 301 in the third preferred embodiment, this is only exemplary and the present invention is not limited to this layout relationship. For example, one ADC unit 307 for a plurality of pixel columns can be arranged and the one ADC unit 307 can be used in a time division configuration among the plurality of pixel columns. The column processing unit 306 includes an AD conversion circuit which converts an analog pixel signal read from a unit pixel 302 of a selected pixel row of the image pickup unit 301 into digital pixel data along with the ramp unit 313, the delay unit 315, and the arithmetic unit 321 as will be described later.

The delay unit 315 has an annular delay circuit 316 including a voltage controlled oscillator (VCO) circuit which is a symmetric oscillation circuit. However, the delay unit 315 is not limited thereto. Although the annular delay circuit itself includes an odd number of delay units as in the symmetric oscillation circuit, a so-called asymmetric oscillation circuit in which the number of outputs is equivalently an even number (particularly, a power of two) may be used. Further, a circuit in which the annular delay circuit itself includes an even number (particularly, a power of two) of delay units and the number of outputs (terminals) of the lower-order logic state is an even number (particularly, a power of two) or a so-called fully differential oscillation circuit in which the annular delay circuit itself includes an even number (particularly, a power of two) of delay units and the outputs of the final stage of the fully differential inversion circuit constituting the delay unit are fed back to the reverse side of the inputs of the initial stage may be used. Further, although the annular delay circuit is suitable for the delay unit 315, the present invention is not limited thereto.

The ramp unit 313, for example, includes an integrating circuit. According to control of the control unit 319, the ramp unit 313 generates a so-called ramp wave, the level of which changes along a gradient with the passage of time, and supplies the ramp wave to one of input terminals of a comparison unit 308 via the reference signal line 314. The ramp unit 313 is not limited to the integrating circuit, and a digital-to-analog conversion (DAC) circuit may be used. However, in the case of a configuration in which a ramp wave is digitally generated using the DAC circuit, a configuration that makes the step of the ramp wave fine or a configuration equivalent thereto is necessary.

The horizontal selection unit 320 includes a shift register, a decoder, or the like. The horizontal selection unit 320 controls column addressing or column scanning of the ADC unit 307 of the column processing unit 306. According to control of the horizontal selection unit 320, digital data subjected to ADC by the ADC unit 307 is sequentially read to the horizontal signal line 312.

The arithmetic unit 321 performs code conversion such as binarization based on digital data output to the horizontal signal line 312, and outputs binary digital data. In addition, the arithmetic unit 321 may have embedded signal processing functions, for example, such as black level adjustment, column variation correction, color processing, and the like. Further, the arithmetic unit 321 may be configured to convert n-bit parallel digital data into serial data and output the serial data.

The control unit 319 includes a functional block of a timing generator (TG) which supplies predetermined timing pulse signals or clocks necessary for operations of units such as the ramp unit 313, the delay unit 315, the vertical selection unit 317, the horizontal selection unit 320, and the arithmetic unit 321, and a functional block for communicating with the TG. In addition, the control unit 319 also includes a function serving as the control unit 16 of the above-described first and second preferred embodiments, and outputs the control signal Enable for controlling the latch circuits D_0 to D_7 of the column processing unit 306.

Further, the control unit 319 may be provided as another semiconductor integrated circuit so as to be independent of other functional elements such as the image pickup unit 301 or the vertical selection unit 317 and the horizontal selection unit 320. In this case, an image pickup device, which is an example of a semiconductor system, is constructed by the control unit 319 and an image pickup device including the image pickup unit 301 or the vertical selection unit 317, the horizontal selection unit 320, and the like. The image pickup device may be provided as an image pickup module embedded with a peripheral signal process, a power-supply circuit, or the like.

Next, a configuration of the ADC unit 307 will be described. The ADC unit 307 generates a time interval having the magnitude (pulse width) of a time-axis direction corresponding to each magnitude of the pixel signal by comparing an analog pixel signal read from each unit pixel 302 of the image pickup unit 301 via the vertical signal line 303 to ramp waves for ADC provided from the ramp unit 313. The ADC is performed by designating data corresponding to the time interval as digital data corresponding to the magnitude of a pixel signal.

Hereinafter, details of the configuration of the ADC unit 307 will be described. The ADC unit 307 is provided for every column. In FIG. 7, six ADC units 307 are provided. The ADC units 307 of the columns have the same configuration. The ADC unit 307 includes the comparison unit 308, a latch control unit 309, a latch unit 310, and a column counter unit 311.

The comparison unit 308 corresponds to the comparison unit 11 described in the above-described first and second preferred embodiments. The comparison unit 308 converts the magnitude of the pixel signal into a time interval (pulse width), which is information of the time-axis direction, by comparing a signal voltage corresponding to an analog pixel signal output from the unit pixel 302 of the image pickup unit 301 via the vertical signal line 303 to a ramp voltage of ramp waves supplied from the ramp unit 313. A comparison output of the comparison unit 308, for example, has a low level when a ramp voltage is greater than a signal voltage, and has a high level when the ramp voltage is less than or equal to the signal voltage.

The latch control unit 309 corresponds to the signal generation unit 101 described in the above-described first and second preferred embodiments. The latch control unit 309 generates a control signal for controlling the latch unit 310 and the column counter unit 311 based on the comparison output of the comparison unit 308.

The latch unit 310 corresponds to the latch unit 102 or 201 described in the above-described first and second preferred embodiments. The latch unit 310 has the latch circuits D_0 to D_7 which latch (hold/store) the logic state of the output signal of the delay unit 315. The latch circuits D_0 to D_7 latch the logic state of the output signal of the delay unit 315, and thus lower-order bit data (lower-order data) constituting digital data is obtained.

The latch circuits D_0 to D_6, which receive a comparison output of the comparison unit 308 and constitute the latch unit 310, are in the enable state at the timing (first timing) at which the comparison output is inverted. After a predetermined time has elapsed from the first timing (second timing), the respective latch circuits D_0 to D_7 of the latch unit 310 latch the logic state of the output signal of the delay unit 315. For example, when the latch unit 201 of the above-described second preferred embodiment has been used as the latch unit 310, the latch circuits D_0 to D_7 are in the disable state at the timing at which the latch circuits D_0 to D_7 of the latch unit 310 latch the logic state corresponding to the output signal of the delay unit 315.

The column counter unit 311 corresponds to the count unit 14 described in the above-described first and second preferred embodiments. The column counter unit 311 performs a count operation based on an output signal of the latch circuit D_7 of the latch unit 310. Here, the column counter unit 311 is assumed to have a latch function which holds the logic state of the column counter unit 311. The column counter unit 311 performs the count operation and thus higher-order bit data (higher-order data) constituting digital data is obtained.

Here, a lower-order data signal corresponding to the logic state of the output signal of the delay unit 315 latched in the latch unit 310, for example, is 8-bit data. In addition, a higher-order data signal constituted by a count value of the column counter unit 311, for example, is 10-bit data. Further, 10 bits are just an example and a number of bits less than 10 bits (for example, 8 bits) or a number of bits greater than 10 bits (for example, 12 bits) may be used.

Next, an operation of this example will be described. Here, although the description of the specific operation of the unit pixel 302 is omitted, the unit pixel 302 outputs a reset level and a signal level as is well known. The output reset level and signal level are subjected to correlated double sampling (CDS) processing in the analog unit 305, and the CDS processing result is output as a difference signal.

The ADC is performed as follows. For example, digital data corresponding to a magnitude of the difference signal is obtained by comparing voltages of the ramp wave falling at a predetermined slope and the pixel signal and measuring a period from a point in time at which the comparison process has been started to a point in time (second timing) at which a predetermined time has elapsed from a point in time (first timing) at which the voltage of the difference signal has been consistent with the voltage (ramp voltage) of the ramp waves using a count value based on an output signal (for example, corresponding to the output signal CK7) of the annular delay circuit 316 and logic states of multi-phase clocks (corresponding to the output signals CK0 to CK7) having a constant phase difference which is an output signal of the annular delay circuit 316. Further, the ADC is performed by reading a reset level including noise in a first read operation from each unit pixel 302 of a selection row of the image pickup unit 301. Next, the ADC is performed by reading a signal level in a second read operation. Thereafter, digital data corresponding to the difference signal may be obtained by digitally performing CDS processing. The present invention is not limited thereto.

After a pixel signal output from the unit pixel 302 of an arbitrary pixel row to the vertical signal line 303 has been stabilized, the control unit 319 supplies control data of ramp-wave generation to the ramp unit 313. The ramp unit 313 receiving the control data outputs ramp waves that temporally change in an overall ramp shape as a comparison voltage applied to one input terminal of the comparison unit 308. The comparison unit 308 compares the ramp waves to the difference signal from the analog unit 305. At this time, the control unit 319 changes a start pulse to be output to the annular delay circuit 316 from the low level to the high level. The column counter unit 311 performs a count operation using an output signal of the latch circuit D_7 of the latch unit 310 as a count clock.

The comparison unit 308 compares the ramp waves applied from the ramp unit 313 to the difference signal from the analog unit 305, and inverts a comparison output when two signal voltages are approximately consistent (first timing). The comparison output is further inverted or delayed and output (second timing). At the first timing, the latch circuits D_0 to D_6 of the latch unit 310 are in the enable state based on the comparison output of the comparison unit 308. At the second timing, the control signal from the latch control unit 309 is changed from the high state to the low state and thus the latch circuits D_0 to D_7 of the latch unit 310 latch the logic state corresponding to the output signal of the delay unit 315. For example, when the latch unit 201 of the above-described second preferred embodiment has been used as the latch unit 310, the latch circuits D_0 to D_7 are in the disable state at the timing at which the latch circuits D_0 to D_7 of the latch unit 310 latch the logic state corresponding to the control signal of the delay unit 315.

The latch circuit D_7 of the latch unit 310 is stopped and hence the column counter unit 311 latches a count value. Thereby, digital data (a data signal) corresponding to the difference signal is obtained. When a predetermined period has elapsed, the control unit 319 stops the supply of the control data to the ramp unit 313 and the output from the delay unit 315. Thereby, the ramp unit 313 stops the generation of ramp waves.

Thereafter, the digital data is transferred to the arithmetic unit 321 via the horizontal signal line 312 using the horizontal selection unit 320. In the arithmetic unit 321, a binarization process is executed and binary data is obtained. Further, the arithmetic unit 321 may be configured to be embedded in the column processing unit 306.

In the above-described operation, because the control signal from the latch control unit 309 is changed from the high state to the low state at the second timing and thus the latch circuits D_0 to D_7 of the latch unit 310 latch the logic state corresponding to the output signal of the delay unit 315, it is possible to prevent AD conversion accuracy from being degraded without a deviation in the timing at which the output signal of the delay unit 315 is latched between the latch circuits D_0 to D_6 and the latch circuit D_7.

Further, in terms of the configuration or control of the latch circuits D_0 to D_7 constituting the latch unit 310 in the third preferred embodiment, various modifications described in the first and second preferred embodiments may be made.

The present invention provides an AD conversion circuit and a solid-state image pickup device capable of preventing AD conversion accuracy from being degraded.

According to an preferred embodiment of the present invention, because each of first to $n^{th}$ latch units latches each of first to $n^{th}$ clock signals based on a second comparison signal output from one signal generation unit, it is possible to reduce a deviation in a timing at which each of the first to $n^{th}$ latch units performs a latch operation and to prevent the AD conversion accuracy from being degraded.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. An analog-to-digital (AD) conversion circuit comprising:
  a comparison unit configured to receive an analog signal and a reference signal that increases or decreases with passage of time, the comparison unit being configured to compare voltages of the analog signal and the reference signal, the comparison unit being configured to output a first comparison signal at a first timing at which the voltages of the analog signal and the reference signal have a predetermined relationship;
  a signal generation unit configured to output a second comparison signal for switching a logic state at a second timing at which a predetermined time has elapsed from the first timing, the signal generation unit being configured to output a third comparison signal that is a result of a logic operation on the first comparison signal and the second comparison signal;
  a control unit configured to output an enable signal at least between a timing relating to a comparison start of the comparison unit and the second timing;
  a clock generation unit configured to output first to $n^{th}$ (n is a natural number equal to or greater than 2) clock signals having different phases;
  a latch unit that includes first to $n^{th}$ latch units, each of the first to $n^{th}$ latch units including an input terminal that receives a corresponding one of the first to $n^{th}$ clock signals, a first control terminal that receives the third comparison signal or the enable signal, a second control terminal that receives the second comparison signal, and an output terminal, each of the first to $n^{th}$ latch units latching a logic state of the one of the first to $n^{th}$ clock signals input to the input terminal; and
  a count unit configured to perform a count operation based on a signal from the output terminal of the $n^{th}$ latch unit, wherein
  each of first to $(n-k)^{th}$ (k is a natural number which is greater than or equal to 1 and less than or equal to n−1) latch units is in an enable state based on the third comparison signal,
  each of $(n-k+1)^{th}$ to $n^{th}$ latch units is in the enable state based on the enable signal, and
  each of the first to $n^{th}$ latch units latches each of the first to $n^{th}$ clock signals when the logic state of the second comparison signal is switched.

2. The AD conversion circuit according to claim 1, wherein each of the first to $n^{th}$ latch units includes:
  a logic circuit that includes a first input terminal connected to the input terminal and a second input terminal connected to the first control terminal;
  a first inverting circuit that is connected between the logic circuit and the output terminal;
  a second inverting circuit that is connected between the first inverting circuit and the output terminal; and
  a switch circuit that is connected to the second control terminal, the switch circuit being configured to connect the logic circuit, the first inverting circuit, and the second inverting circuit in series between the input terminal and the output terminal before the second comparison signal is input to the second control terminal, the switch circuit being configured to disconnect the logic circuit and the first inverting circuit and to connect the first inverting circuit and the second inverting circuit so that a signal output from one of the first inverting circuit and the second inverting circuit is input to the other of the first inverting circuit and the second inverting circuit after the second comparison signal has been input to the second control terminal, and wherein, when the third comparison signal of a high or low state has been input to the second input terminal, the logic state of the output terminal is fixed to the high or low state regardless of a logic state of a clock signal input to the first input terminal.

3. The AD conversion circuit according to claim 1, wherein the signal generation unit includes:

a comparison signal delay unit configured to output the second comparison signal obtained by delaying the first comparison signal by a predetermined time; and a first output unit configured to perform the logic operation on the first comparison signal and the second comparison signal, and output the third comparison signal.

4. The AD conversion circuit according to claim 1, wherein the enable signal is a first enable signal, the AD conversion circuit comprises a second output unit configured to be connected between the signal generation unit and one of the $(n-k+1)^{th}$ to $n^{th}$ latch units, the second output unit being configured to receive the first enable signal and the second comparison signal, the second output unit being configured to output a second enable signal that is a result of a logic operation on the first enable signal and the second comparison signal, and the second enable signal instead of the first enable signal is input to the first control terminal in one of the $(n-k+1)^{th}$ to $n^{th}$ latch units connected to the second output unit.

5. A solid-state image pickup device comprising:

an image pickup unit in which a plurality of pixels are arranged in a matrix shape, each of the plurality of pixels being configured to output a pixel signal according to an incident physical amount; and the AD conversion circuit according to claim 1 to which the analog signal corresponding to the pixel signal is input, wherein the comparison unit, the latch unit, the count unit, and the signal generation unit are arranged in every one or more columns of the pixels constituting the image pickup unit.

\* \* \* \* \*